United States Patent
Yen et al.

(10) Patent No.: US 9,287,898 B2
(45) Date of Patent: Mar. 15, 2016

(54) METHOD AND CIRCUIT FOR SHORTENING LATENCY OF CHIEN'S SEARCH ALGORITHM FOR BCH CODEWORDS

(71) Applicant: Storart Technology Co., Ltd., Hsinchu (TW)

(72) Inventors: Chih Nan Yen, Hsinchu (TW); Jui Hui Hung, Hsinchu (TW); Hsueh Chih Yang, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 88 days.

(21) Appl. No.: 14/200,570

(22) Filed: Mar. 7, 2014

(65) Prior Publication Data

US 2015/0256200 A1    Sep. 10, 2015

(51) Int. Cl.
*H03M 13/15* (2006.01)
*H03M 13/53* (2006.01)

(52) U.S. Cl.
CPC ........ *H03M 13/1545* (2013.01); *H03M 13/152* (2013.01)

(58) Field of Classification Search
CPC .......... H03M 13/1545; H03M 13/152; H03M 13/15; H03M 13/151; H03M 13/1515; G06F 11/1068; H04L 1/0057
See application file for complete search history.

(56) References Cited

U.S. PATENT DOCUMENTS

| | | | |
|---|---|---|---|
| 7,774,688 B1 * | 8/2010 | Teng et al. | 714/782 |
| 2005/0172208 A1 * | 8/2005 | Yoon | 714/784 |
| 2009/0199075 A1 * | 8/2009 | Demjanenko et al. | 714/784 |

* cited by examiner

*Primary Examiner* — April Y Blair
*Assistant Examiner* — Dipakkumar Gandhi
(74) *Attorney, Agent, or Firm* — Che-Yang Chen; Law Office of Michael Chen

(57) ABSTRACT

A method for shortening latency of Chien's search and related circuit are disclosed. The method includes the steps of: determining a shifted factor, p; receiving a BCH codeword; computing a syndrome from the BCH codeword; finding an error-location polynomial based on the syndrome; and processing Chien's search for the error-location polynomial to find out roots thereof. p is a number of successive zeroes from the first bit of the BCH codeword, the Chien's search starts iterative calculations by substituting a variable of the error-location polynomial with a nonzero element in Galois Field, GF($2^m$), and the nonzero element ranges from $\alpha^{p+1}$ to $\alpha^n$, wherein n is a codelength of the BCH codeword and equals $2^m-1$, and m is a positive integer.

17 Claims, 8 Drawing Sheets

METHOD AND CIRCUIT FOR SHORTENING LATENCY OF CHIEN'S SEARCH ALGORITHM FOR BCH CODEWORDS

FIELD OF THE INVENTION

The present invention relates to a method and circuit to shorten latency of Chien's search algorithm. More particularly, the present invention relates to a method and circuit to shorten latency of Chien's search algorithm for BCH codewords.

BACKGROUND OF THE INVENTION

Bose-Chaudhuri-Hocquenghem (BCH) code is one of the most widely used error correction code (ECC) techniques in the storage and communication devices. BCH code can detect and correct random errors occurred due to channel noises and defects within memory devices. To construct a BCH codeword, one should define a code length n, an error correction ability t and a primitive polynomial over extension field $GF(2^m)$. The encoding procedures of BCH codeword can be easily implemented by linear feedback shift register (LFSR) and some combination logics together. Comparing with encoding procedures of the BCH codewords, decoding procedures of the BCH codewords are much complicated as shown in FIG. 1.

After receiving a codeword (S01), in order to decode it, one should compute a syndrome according to specified polynomials (S02). Then, depending on the syndrome, an error-location polynomial can be found (S03). Next, by calculating the roots of the error-location polynomial, error-location numbers can be obtained (S04). Finally, an erroneous codeword can be corrected by above steps (S05).

Conventionally, one may adopt Peterson-Gorenstein-Zierler algorithm (PGZ) or Berlekamp-Massey (BM) algorithm to find out the error-location polynomial. Since the computational complexity of PGZ algorithm is higher than BM algorithm and BM algorithm can achieve higher decoding speed, BM algorithm is much popular for hardware implementation.

According to the error-location polynomial $\lambda(x)=\lambda_0+\lambda_1 x+\ldots+\lambda_t x^t$, the roots of $\lambda(x)$ can be found simply by substituting 1, $\alpha$, $\alpha^2$, ..., $\alpha^{n-1}$ ($n=2^m-1$) into $\lambda(x)$. Since $\alpha^n=1$, $\alpha^{-1}=\alpha^{n-1}$. Therefore, if $\alpha^1$ is an error-location number, $\alpha^{n-1}$ is another error-location number. Conventionally, this substitution procedure can be operated iteratively by Chien's search, and implemented in a circuit design as shown in FIG. 2.

Please refer to FIG. 2. A conventional Chien's search module 10 is disclosed. The Chien's search module 10 includes a number of calculating units. Each calculating unit 101, 102 ... or 10t (t is any integer greater than 2) includes a multiplexer, a multiplier and a register (i.e., the calculating unit 101 includes a multiplexer 111, a multiplier 121 and a register 131, the calculating unit 102 includes a multiplexer 112, a multiplier 122 and a register 132, and the calculating unit 10t includes a multiplexer 1t, a multiplier 12t and a register 13t). Take the calculating unit 101 for example. In operation, the multiplexer 111 receives the coefficient $\lambda_1$ of the error-location polynomial $\lambda(x)$, the multiplier 121 multiplies the coefficient $\lambda_1$ with a and the product is sent to an adder 170 and then stored in the register 131. Other calculating units run in the same way. The difference is the calculating unit 10k (k is any positive integer small than or equal to t) multiplies $\lambda_k$ with $\alpha^k$ and outputs the product to the adder 170 and stores it in corresponding register.

The adder 170 sums all products from the calculating units 101, 102 ... and 10t with coefficient $\lambda_0$. Thus, $\lambda(\alpha)=\lambda_0+\zeta_1\alpha+\ldots+\lambda_t\alpha^t$ can be obtained. If $\lambda(\alpha)$ equals zero, a is one root of $\lambda(x)$. $\alpha$ indicates a location where an incorrect bit exists. The bit can be corrected. Otherwise, the location indicates doesn't have incorrect bit. Then, an iterative calculation begins. The calculating unit 101 is still taken for example. Product of $\lambda_1\alpha$ stored in the register 131 is inputted to the multiplexer 111 through the multiplier 121. This time, new product, $\lambda_1\alpha^2$, is generated. Similarly, $\lambda_2\alpha^4$ ... and $\lambda_t\alpha^{2t}$ are generated from calculating unit 102 ... and 10t, respectively. Thus, $\lambda(\alpha^2)=\lambda_0+\lambda_1\alpha^2+\ldots+\lambda_t\alpha^{2t}$ can be obtained by the adder 170. If $\lambda(\alpha^2)$ equals zero, $\alpha^2$ is one root of $\lambda(x)$. $\alpha^2$ indicates another location where an incorrect bit exists. The iterative calculation stops after the n cycle is finished.

It is obvious from above that calculation load is significant since the whole processes takes n $(2^m-1)$ times of iteration. However, improvement of hardware can conquer this time consumptive problem and shorten latency of Chien's search. On the other hand, it is necessary that latency of Chien's search should be further shortened because data transition becomes massive and speed is fast than ever. Among the procedures of decoding of BCH codewords, Chien's search takes the most of time (around 40% of total time consumed). How to shorten latency of Chien's search is the key point to enhance efficiency of decoding BCH codewords.

SUMMARY OF THE INVENTION

According to an aspect of the present invention, a method for shortening latency of Chien's search includes the steps of: determining a shifted factor, p; receiving a BCH codeword; computing a syndrome from the BCH codeword; finding an error-location polynomial based on the syndrome; and processing Chien's search for the error-location polynomial to find out roots thereof. Numeral p is a number of successive zeroes from the first bit of the BCH codeword. The Chien's search starts iterative calculations by substituting a variable of the error-location polynomial with a nonzero element in Galois Field, $GF(2^m)$. The nonzero element ranges from $\alpha^{p+1}$ to $\alpha^n$. Numeral n is a codelength of the BCH codeword and equals $2^m-1$. Numeral m is a positive integer.

According to another aspect of the present invention, a circuit for shortening latency of Chien's search includes: a number of calculating units, each iteratively substituting a variable to a specified power of an error-location polynomial having maximum power of t with a nonzero element, k, in $GF(2^m)$, for multiplying a corresponding coefficient of the error-location polynomial by k to the specified power as a cyclic product and outputting the cyclic product, wherein k changes from $\alpha^{p+1}$ to $\alpha^n$ sequentially for each iterative calculation, wherein n is a codelength of a BCH codeword and equals $2^m-1$, p is a number of successive zeroes from the first bit of the BCH codeword and m is a positive integer; and a finite adder for summing a constant coefficient of the error-location polynomial and all cyclic products outputted from the calculating units in the same iterative calculation as a judging factor.

Preferably, the circuit further has a judging module for judging if the judging factor is zero.

According to the present invention, the coefficients of the error-location polynomial may be provided by an error-location polynomial generator.

Preferable, the calculating unit include: a coefficient multiplexer for receiving the corresponding coefficient of the error-location polynomial and one cyclic product, and outputting the corresponding coefficient of the error-location polynomial during a first cycle and the cyclic product during cycles later than the first cycle as a first data; a resister, electrically linked to the coefficient multiplexer, for temporarily storing the first data for one cycle and outputting the first data; a shifting multiplier, electrically linked to the resister, for multiplying the first data by rk/α as a second data and outputting the second data; a shifting multiplexer, electrically linked to the resister and shifting multiplier, for receiving the first data and the second data and outputting the second data during a second cycle after the first cycle and the first data during cycles later than the second cycle; and an iterative multiplier, electrically linked to the shifting multiplexer, coefficient multiplexer and finite adder, for receiving the first data and second data, multiplying the received first data or second data by $\alpha^r$ as the cyclic product and outputting the cyclic product to the finite adder and coefficient multiplexer. Numeral r is a positive integer, varies from 1 to t in one iterative calculation, and represents the order of the power of the variable in the error-location polynomial the calculating unit is for.

According to still another aspect of the present invention, a circuit for shortening latency of Chien's search includes: a number of calculating units, each iteratively substituting a variable to a specified power of an error-location polynomial having maximum power of t with a nonzero element, k, in $GF(2^m)$, for simultaneously multiplying a corresponding coefficient of the error-location polynomial by k, changing from $\alpha^{p+(j-1)s+1}$ to $\alpha^{p+js}$, to the specified power as cyclic products in the $j^{th}$ iterative calculation and outputting s cyclic products in the $j^{th}$ iterative calculation, wherein n is a codelength of a BCH codeword and equals $2^m-1$, p is a number of successive zeroes from the first bit of the BCH codeword, m and j are positive integers, s is a number of sets of parallel computing and the operation terminates when k runs to $\alpha^n$; and s finite adders, each summing a constant of the error-location polynomial and all cyclic products for one specified k outputted from the calculating units in the same iterative calculation as a judging factor.

Preferably, each calculating unit includes: a coefficient multiplexer for receiving the corresponding coefficient of the error-location polynomial and one cyclic product, and outputting the corresponding coefficient of the error-location polynomial during a first cycle and the cyclic product during cycles later than the first cycle as a first data; a resister, electrically linked to the coefficient multiplexer, for temporarily storing the first data for one cycle and outputting the first data; a shifting multiplier, electrically linked to the resister, for multiplying the first data by rk/α as a second data and outputting the second data; a shifting multiplexer, electrically linked to the resister and shifting multiplier, for receiving the first data and the second data and outputting the second data during a second cycle and the first data during cycles later than the second cycle; and s iterative multipliers, electrically linked to the shifting multiplexer, each receiving the first data and second data, multiplying the first data or second data by $\alpha^{qr}$ as the cyclic product, and outputting the cyclic products to the finite adders, respectively, wherein the iterative multiplier outputs the cyclic product of $\alpha^{t(p+s)}$ outputs the cyclic product to the coefficient multiplexer. r is a positive integer, varies from 1 to t in one iterative calculation and represents the order of the power of the variable in the error-location polynomial the calculating unit is for. q is a positive integer and ranges from 1 to s in one iterative calculation.

According to the present invention, an Error Correcting Code (ECC) decoder can include the aforementioned circuits for decoding BCH codewords.

Comparing with conventional Chien's search, the present invention can skip p times of iterative calculations. Therefore, it is obvious that latency of Chien's search can significantly shortened by applying the present invention.

DETAILED DESCRIPTION OF THE PREFERRED EMBODIMENTS

The present invention will now be described more specifically with reference to the following embodiments.

First Embodiment

Figure 3:
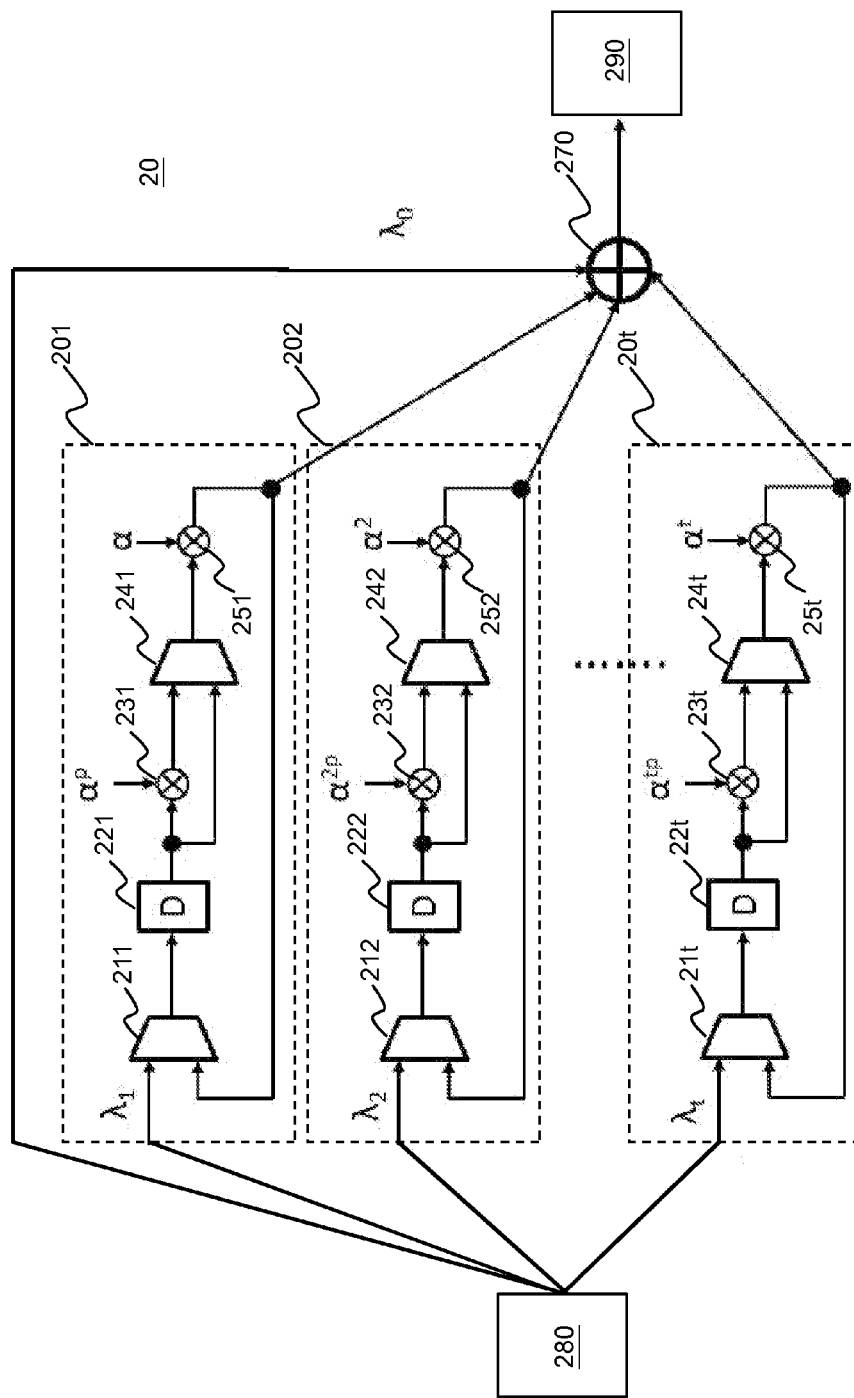
FIG. 3 is a block diagram of a circuit for shortening latency of Chien's search in a first embodiment according to the present invention.

Please refer to FIG. 3. A first embodiment is illustrated. A circuit 20 is used to shorten latency of Chien's search. The circuit 20 includes t calculating units. To simply illustration, only a first calculating unit 201, a second calculating unit 202 and a $t^{th}$ calculating unit 20t are drawn. The rest calculating units are omitted but structures and functions thereof can be understood by the description below. The circuit 20 also includes a finite adder 270, an error-location polynomial generator 280 and a judging module 290.

All of the calculating units operate in the same way. The only difference is one calculating unit is used for iterative calculation regarding a specified coefficient of an error-location polynomial or variable to the specified power. Let's define the error-location polynomial, λ(x), as $\lambda(x) = \lambda_0 + \lambda_1 x + \ldots + \lambda_t x^t$. It means λ(x) has maximum power of t. The first calculating unit 201 is used for iterative calculation regarding $\lambda_1$ and x to the first power. Similarly, the second calculating unit 202 is for $\lambda_2$ and x to the second power. The $t^{th}$ calculating unit 20t is for $\lambda_t$ and x to the $t^{th}$ power. Take the first calculating unit 201 for example. The first calculating unit 201 iteratively substitutes x to the first power of λ(x) with a nonzero element, k, in $GF(2^m)$. Numeral k may be $\alpha^{p+1}$, $\alpha^{p+2} \ldots \alpha^n$. Thus, k changes from $\alpha^{p+1}$ to $\alpha^n$ sequentially for each iterative calculation. For those skilled in the art, it is known to process Chien's search by substituting 1, $\alpha^1$, $\alpha^2 \ldots \alpha^n$ iteratively to get roots of λ(x). For the present invention, the spirit to shorten latency of Chien's search is to bypass p iterative calculations. It means that from $\alpha^1$ to $\alpha^p$ can be omitted and not calculated (1 is not a root according to the present invention).

Figure 4:
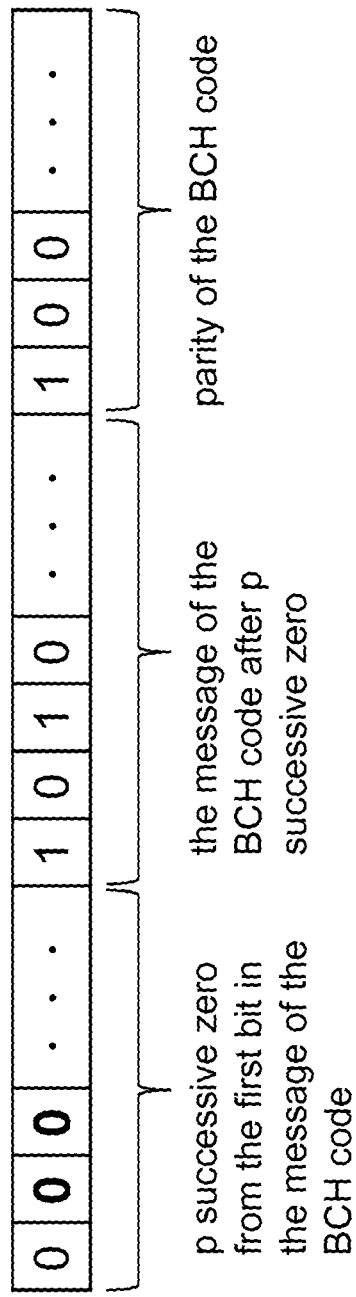
FIG. 4 illustrates a structure of a BCH codeword.
Figure 5:
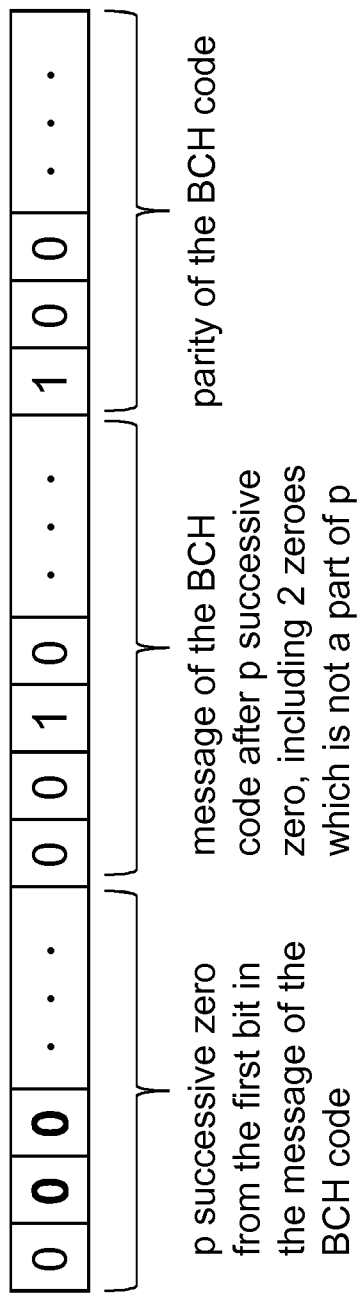
FIG. 5 illustrates another structure of a BCH codeword.

Here, n is a codelength of a BCH codeword. It is an integer and equals to $2^m-1$. For instance, if m is 6, n will be $2^6-1$ and it is 63. Numeral m can be any positive integer for a specified Galois filed. Numeral p is a shifted factor and is the number of successive zeroes from the first bit of the BCH codeword. Please refer to FIG. 4 and FIG. 5. A BCH codeword can be divided into two parts, the message part and parity part. For BCH codewords, usually, an encoder encodes a message and successive zeroes come out from the first bit of the codeword. Therefore, a shortened BCH codeword can be made. The way is just removed the successive zeroes. It means there is no error found in this part. It is not necessary to search this region. For example, consider a 6-error-correcting (4174, 4096) BCH codeword, a shorten codeword of (8191, 8113) standard BCH codeword over $GF(2^{13})$. A shortened BCH codeword can be recognized as a standard BCH codeword with zero sequence. The shifted factor p should be 8191−4174=4071. Additionally, if it is already known that there are 100 bits of codeword are all zeroes, the shifted factor p should be 100. It should be emphasized that value of p can be changed for various regions with zero sequences. Several zeroes can be left in the beginning of the message part as shown in FIG. 5.

According to the present invention, when a shortened BCH codeword is received, it is often be noticed by the encoder how many zeroes (p) are removed to get the shortened BCH. Again, the shortened BCH codeword can be recognized as a standard BCH codeword with p zeroes in the beginning of the BCH codeword. Thus, the shortened BCH codeword can be reverted to the original BCH codeword with p zeroes added and keeps Chien's search by applying the method provided by the present invention. Of course, it is also workable to directly apply the present invention to a standard BCH codeword.

The first calculating unit 201 multiplies $\lambda_1$ by k and $\lambda_1\alpha^{p+1}$, $\lambda_1\alpha^{p+2} \ldots \lambda_1\alpha^n$ will be available in each iterative calculation. They are defined as cyclic products. Similarly, the second calculating unit 202 gets $\lambda_2\alpha^{2(p+1)}$, $\lambda_2\alpha^{2(p+2)} \ldots \lambda_2\alpha^{2n}$ and the $t^{th}$ calculating unit 20t gets $\lambda_t\alpha^{t(p+1)}$, $\lambda_t\alpha^{t(p+2)} \ldots \lambda_t\alpha^{tn}$. After each iterative calculation is done, the calculating units all output the corresponding cyclic product simultaneously to the finite adder 270. The finite adder 270 sums a constant coefficient, $\lambda_0$, of $\lambda(x)$ and all cyclic products outputted from the calculating units as a judging factor. For example, in one cycle, the judging factor may be $\lambda_0+\lambda_1\alpha^{p+3}+\lambda^{2(p+3)}+\ldots+\lambda_t\alpha^{t(p+3)}$. The judging factor is judged by the judging module 290 to see if it is zero. If yes, it is indicated that the k is a root of $\lambda(x)$. In order to facilitate operation of the circuit 20, the error-location polynomial generator 280 is used to provide a coefficient of $\lambda(x)$ to a specified calculating unit.

Figure 1:
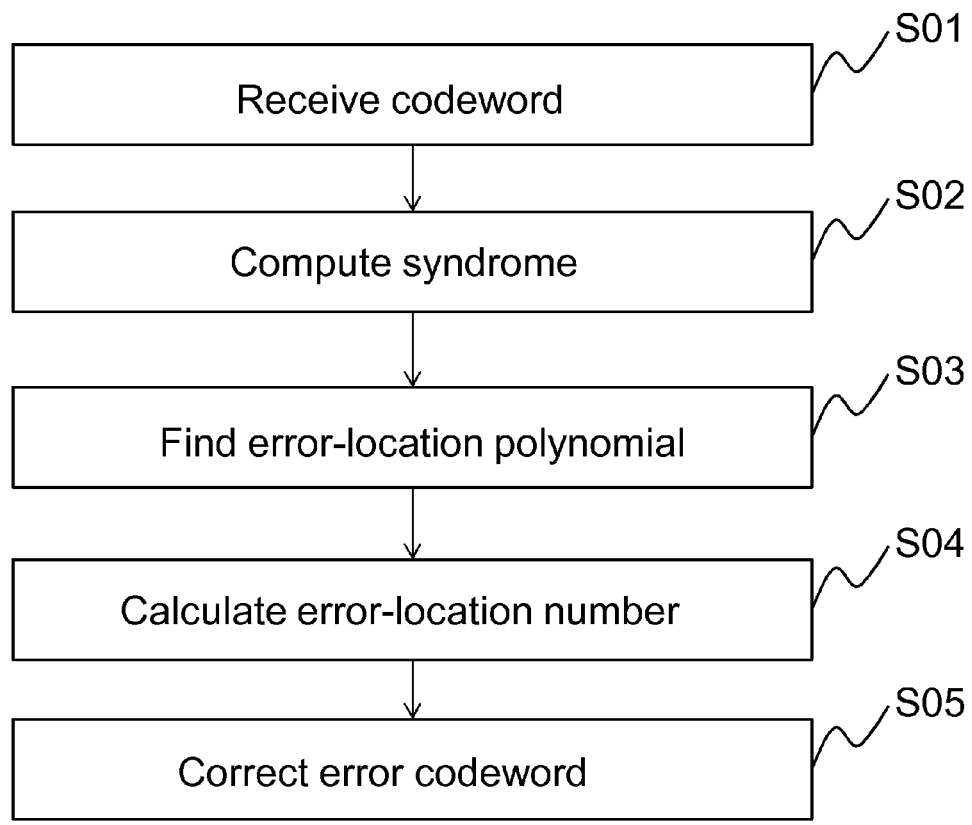
FIG. 1 is a flow chart of conventional decoding procedures of BCH codewords.
Figure 2:
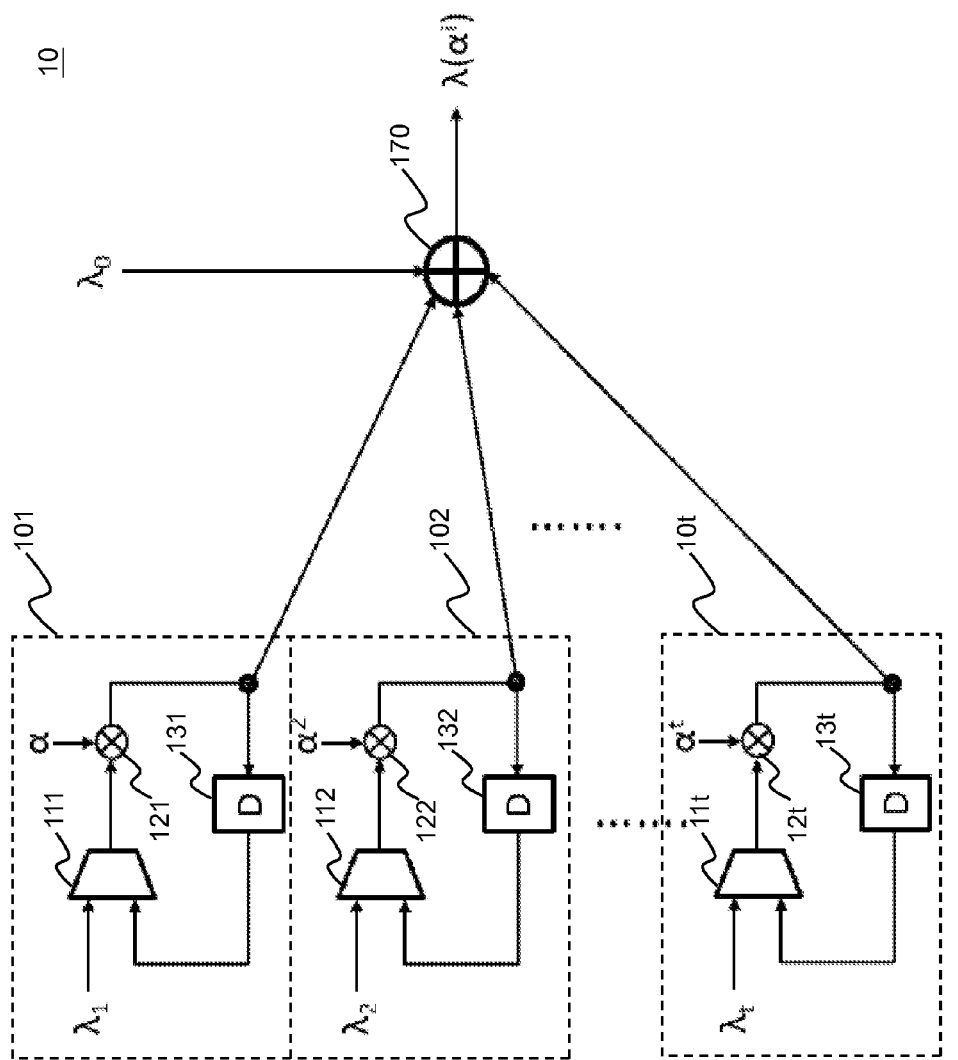
FIG. 2 is a block diagram of a conventional Chien's search module.

A detailed illustration of the calculating unit is described below. Please see FIG. 2 again. The first calculating unit 201 includes a coefficient multiplexer 211, a resister 221, a shifting multiplexer 231, a shifting multiplexer 241, and an iterative multiplier 251. Similarly, the second calculating unit 201 has a coefficient multiplexer 212, a resister 222, a shifting multiplexer 232, a shifting multiplexer 242, and an iterative multiplier 252. The $t^{th}$ calculating unit 20t has a coefficient multiplexer 21t, a resister 22t, a shifting multiplexer 23t, a shifting multiplexer 24t, and an iterative multiplier 25t. The components have the same name have similar functions. Still, take the first calculating unit 201 as an example for illustration. Differences of components with the same names will be pointed out in the description.

The coefficient multiplexer 211 can receive $\lambda_1$ of $\lambda(x)$ from the error-location polynomial generator 280 and one cyclic product form the iterative multiplier 251. It outputs $\lambda_1$ of $\lambda(x)$ during a first cycle and the cyclic product during cycles later than the first cycle as a first data. That is when it is during the first cycle, the first data is $\lambda_1$. During the second cycle, the first cycle becomes $\lambda_1\alpha^{p+1}$. The resister 221 is electrically linked to the coefficient multiplexer 211. It can temporarily stores the first data for one cycle and outputs the first data. The first data can stay in the resister 221 for one cycle. The shifting multiplier 231 is electrically linked to the resister 221. It is used for multiplying the first data by $k/\alpha$ ($\alpha^p$) as a second data and outputting the second data. It should be noticed that the shifting multiplier 232 multiplies corresponding first data by $2k/\alpha$ and the shifting multiplier 23t multiplies corresponding first data by $tk/\alpha$. It can be concluded that an $r^{th}$ shifting multiplier multiplies corresponding first data by $rk/\alpha$. Here, r is a positive integer, varies from 1 to t in one iterative calculation, and represents the order of the power of the variable in $\lambda(x)$ that the corresponding calculating unit is for.

The shifting multiplexer 241 is electrically linked to the resister 221 and shifting multiplier 231. It can receive the first data and the second data in all cycles. During the second cycle, the shifting multiplexer 241 outputs the second data. After the second cycle, during all cycles till the end of Chien's search on one BCH codeword, the shifting multiplexer 241 outputs the first data from the resister 221. The iterative multiplier 251 is electrically linked to the shifting multiplexer 241, coefficient multiplexer 211 and finite adder 270. It receives the first data and second data, multiplies the received first data or second data by $\alpha^r$ as the cyclic product and outputs the cyclic product to the finite adder 270 and coefficient multiplexer 211. Numeral r is the same defined as mentioned above.

Figure 6:
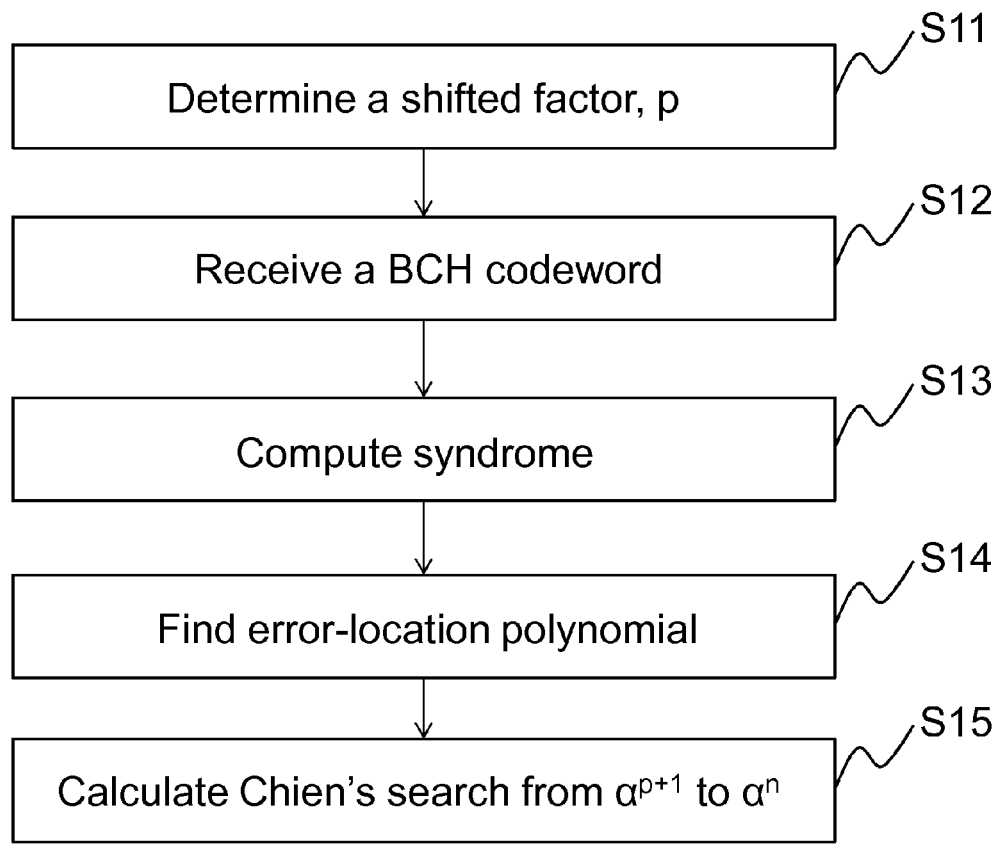
FIG. 6 is a flow chart of operation of the first embodiment.

The method of the present invention can be processes as below. Please refer to FIG. 6. First, determine a shifted factor, p, before Chien's search begins (S11). Numeral p should be noticed by an encoder or a default value. Then, receives a BCH codeword (S12). Compute a syndrome from the BCH codeword (S13). Find an error-location polynomial based on the syndrome (S14). Finally, process Chien's search for the error-location polynomial to find out roots (S15) from $\alpha^{p+1}$ to $\alpha^n$.

Second Embodiment

Figure 7:
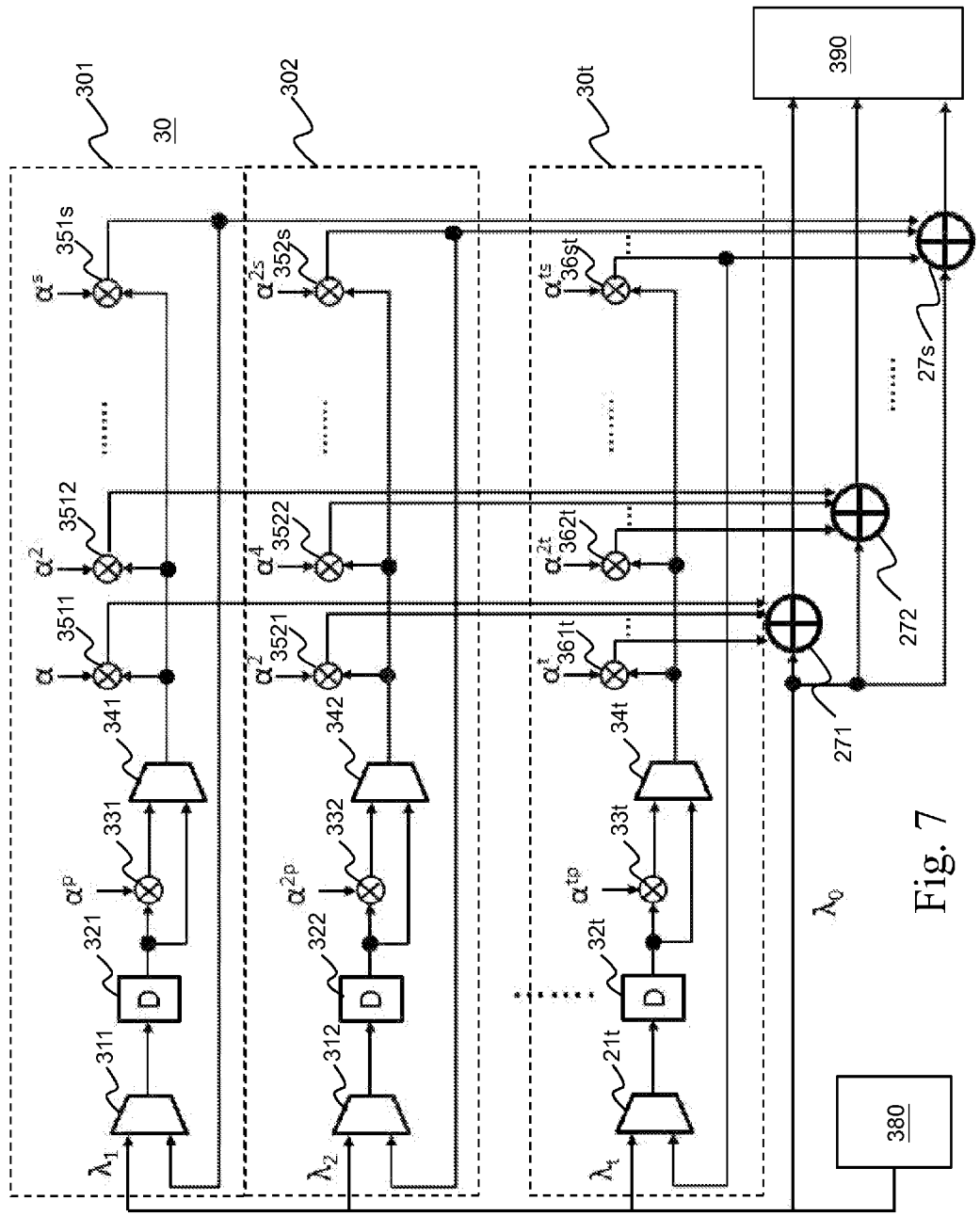
FIG. 7 is a block diagram of a circuit for shortening latency of Chien's search in a second embodiment according to the present invention.

According to the spirit of the present invention, the circuit 20 in the first embodiment can be further parallel computed. Please see FIG. 7. A second embodiment of a circuit 30 having parallel computing ability for shortening latency of Chien's search is presented.

The circuit 30 includes t calculating units. Like the first embodiment, in order to simply illustration, only a first calculating unit 301, a second calculating unit 302 and a $t^{th}$ calculating unit 30t is shown. The rest calculating units are omitted but structures and functions thereof can be understood by the description below. The circuit 30 also includes s finite adders an error-location polynomial generator 380 and a judging module 390. Also, a first finite adder 271, a second finite adder 272 and a $s^{th}$ finite adder 27s are the targets to discuss.

All of the calculating units operate in the same way. The only difference is one calculating unit is used for iterative calculation regarding a specified coefficient of an error-location polynomial or variable to the specified power. Let's use the error-location polynomial, $\lambda(x)$ described in the first embodiment for the second embodiment as well. The first calculating unit 301 is used for iterative calculation regarding $\lambda_1$ and x to the first power. Similarly, the second calculating unit 302 is for $\lambda_2$ and x to the second power. The $t^{th}$ calculating unit 20t is for $\lambda_t$ and x to the $t^{th}$ power. Take the first calculating unit 301 for example. The first calculating unit 301 iteratively substitutes x to the first power of $\lambda(x)$ with a nonzero element, k, in $GF(2^m)$. It is different from the first calculating units in the first embodiment that each calculating unit of the circuit 30 supports parallel computing. For example, the first calculating unit 301 can simultaneously multiply $\lambda_1$ by k where k is a variable and changes from $\alpha^{p+1}$ to $\alpha^{p+s}$, to the first power as cyclic products in one iterative calculation. It then outputs the s cyclic products. Numeral s is a number of sets of parallel computing. It means one calculating unit can do s calculations at the same time. Efficiency and speed of the calculating unit in the second embodiment is s times higher than that in the first embodiment. In the next iterative calculation, k changes from $\alpha^{p+s+1}$ to $\alpha^{p+2s}$. The operation terminates when k runs to $\alpha^n$. In summary, k changes from $\alpha^{p+(j-1)s+1}$ to $\alpha^{p+js}$ in the $j^{th}$ iterative calculation. For example, in the $8^{th}$ iterative calculation, k changes from $\alpha^{p+7s+1}$ to $\alpha^{p+8s}$.

The s finite adders are named as a first finite adder 271, a second finite adder 272 ... and a $s^{th}$ finite adder 27s. Only the three are plotted for illustration. Each of the s finite adders sums $\lambda_0$ of $\lambda(x)$ and all cyclic products for one specified k outputted from the calculating units in the same iterative calculation as a judging factor. For a better understanding, take k for $\alpha^{p+s}$ as an example. A corresponding cyclic product from the first calculating unit 301 for $\alpha^{p+s}$ is $\lambda_1\alpha^{p+s}$. A corresponding cyclic product from the second calculating unit 302 for $\alpha^{p+s}$ is $\lambda_2\alpha^{2(p+s)}$. A corresponding cyclic product from $t^{th}$ calculating unit 30t for $\alpha^{p+s}$ is $\lambda_t\alpha^{t(p+s)}$. The $s^{th}$ finite adder 27s sums $\lambda_0, \lambda_1\alpha^{p+s}, \lambda_2\alpha^{2(p+s)}$ ... and $\lambda_t\alpha^{t(p+s)}$ as the judging factor. If k is $\alpha^{p+s+1}$, it is calculated in the second iterative calculation and the first finite adder 271 may take care of this operation.

Like the circuit 20 in the first embodiment, the judging factor is judged by the judging module 390 to see if it is zero. If yes, it is indicated that k is a root of $\lambda(x)$. In order to facilitate operation of the circuit 30, the error-location polynomial generator 380 is used to provide a coefficient of $\lambda(x)$ to a specified calculating unit. Furthermore, the judging module 390 can have parallel computing ability to deal with s judging factors at the same time. The judging module 390 can also has s parallel computing units to keep up with the speed of the calculating units.

A detailed illustration of the calculating unit is described below. The first calculating unit 301 includes a coefficient multiplexer 311, a resister 321, a shifting multiplexer 331, a shifting multiplexer 341, and s iterative multipliers. For a simplified description, only a first iterative multiplier 3511, a second iterative multiplier 3512 and a $s^{th}$ iterative multiplier 351s are shown. Similarly, the second calculating unit 302 includes a coefficient multiplexer 312, a resister 322, a shifting multiplexer 332, a shifting multiplexer 342, a first iterative multiplier 3521, a second iterative multiplier 3522 and a $s^{th}$ iterative multiplier 352s. The $t^{th}$ calculating unit 30t includes a coefficient multiplexer 31t, a resister 32t, a shifting multiplexer 33t, a shifting multiplexer 34t, a first iterative multiplier 361t, a second iterative multiplier 362t and a st iterative multiplier 36st. The components have the same name have similar functions. Take the first calculating unit 301 as an example for illustration. Differences of components with the same names will be pointed out in the description.

The coefficient multiplexer 311 receives $\lambda_1$ of $\lambda(x)$ from the error-location polynomial generator 380 and one cyclic product form the $s^{th}$ iterative multiplier 351s. It outputs $\lambda_1$ of (x) during a first cycle and the cyclic product during cycles later than the first cycle as a first data. That is when it is during the first cycle, the first data is $\lambda_1$. During the second cycle, the first cycle becomes $\lambda_1\alpha^{p+s}$. The resister 321 is electrically linked to the coefficient multiplexer 311. It can temporarily stores the first data for one cycle and outputs the first data. The first data can stay in the resister 321 for one cycle. The shifting multiplier 331 is electrically linked to the resister 321. It is for multiplying the first data by k/α ($\alpha^p$) as a second data and outputting the second data. It should be noticed that the shifting multiplier 322 multiplies corresponding first data by 2k/α and the shifting multiplier 32t multiplies corresponding first data by tk/α. It can be concluded that a $r^{th}$ shifting multiplier multiplies corresponding first data by rk/α. Here, r is a positive integer, varies from 1 to t in one iterative calculation and represents the order of the power of the variable in $\lambda(x)$ that the calculating unit is for, and q is a positive integer and ranges from 1 to s in one iterative calculation.

The shifting multiplexer 341 is electrically linked to the resister 321 and shifting multiplier 331. It receives the first data and the second data and outputs the second data during a second cycle after the first cycle and the first data during cycles later than the second cycle. s iterative multipliers are electrically linked to the shifting multiplexer 331. Each of the iterative multipliers receives the first data and second data, multiplying the first data or second data by $\alpha^q$ as cyclic products for $q^{th}$ iterative calculation, and outputting the cyclic products to the finite adders, respectively. Generally, the $q^{th}$ iterative multiplier in a $r^{th}$ calculating unit multiplies the first data or second data by $\alpha^{qr}$ as the corresponding cyclic product. It should be noticed that the $s^{th}$ iterative multiplier outputs a cyclic product multiplied corresponding coefficient by $\alpha^{r(p+s)}$ also outputs the cyclic product to the coefficient multiplexer 311.

Figure 8:
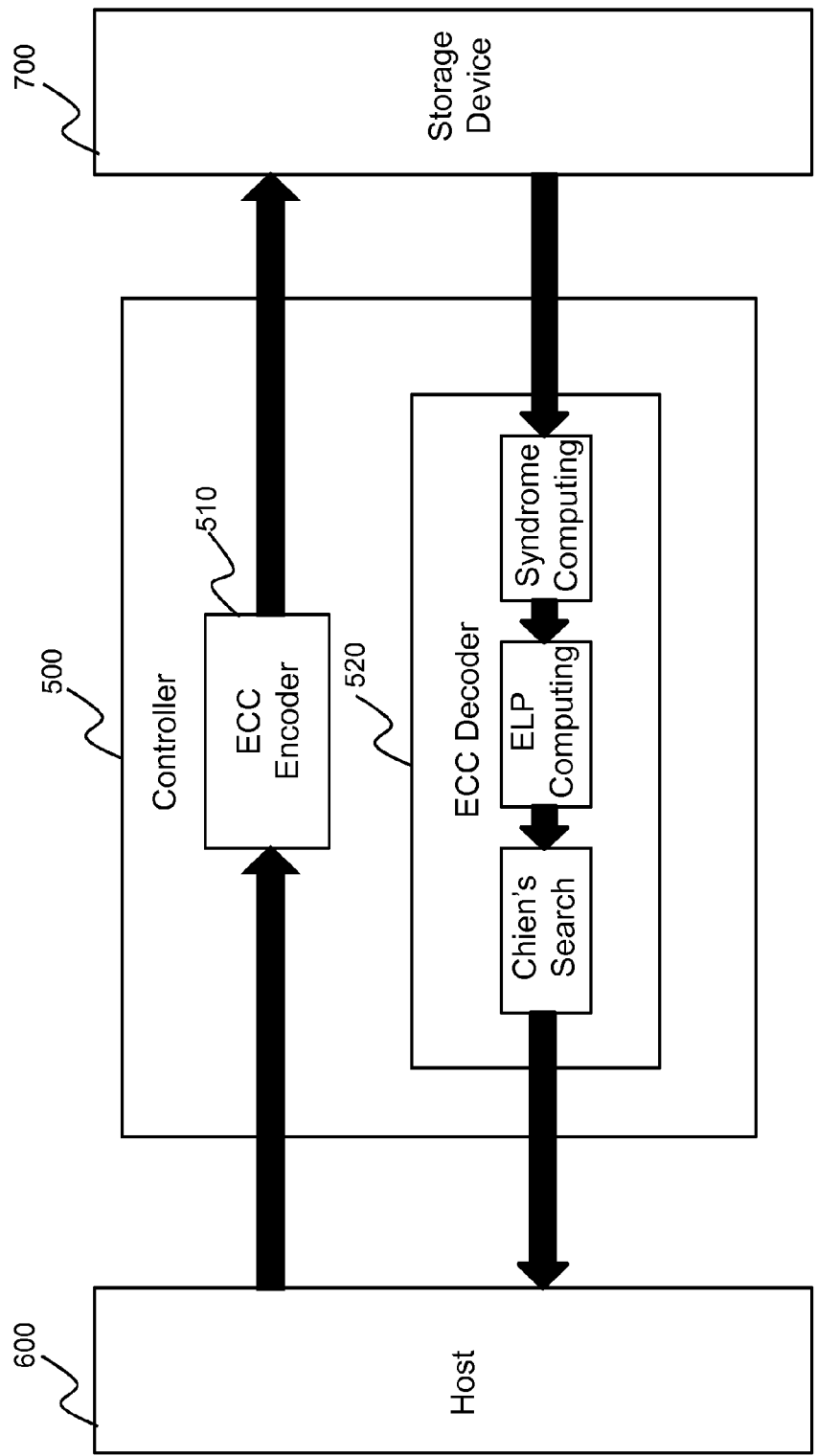
FIG. 8 illustrates an ECC decoder which applies the present invention in an integrated.

Please refer to FIG. 8. For a solution to apply the present invention, a controller 500, including an Error Correcting Code (ECC) encoder 510 and an ECC decoder 520, is bridging between a host 600 and a storage device 700. The host 600 sends a message to be stored in the storage device 700. The message is encoded by the ECC encoder 510 and transferred to the storage device 700. This message can be encoded as a standard BCH codeword or a shortened BCH codeword. When the message is required to read, it is decoded by the ECC decoder 520 and then sent to the host 600. The ECC decoder 520 processes syndrome computing, error-location polynomial computing and Chien's search according to the present invention. In practice, the controller 500 is in the form of an Integrated Circuit (IC) or die. Actually, the ECC encoder 510 and the ECC decoder 520 may be in different ICs or dies due to consideration of cost. Therefore, besides all the circuits mentioned above, the present invention also claims an ECC decoder including the circuits in the embodiments above for decoding BCH codewords.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A method for shortening latency of Chien's search in a circuit, comprising the steps of:
   determining a shifted factor, p;
   receiving a BCH codeword;
   computing a syndrome from the BCH codeword;
   finding an error-location polynomial based on the syndrome; and
   processing Chien's search for the error-location polynomial to find out roots thereof,
   wherein p is a number of successive zeroes from the first bit of the BCH codeword, the Chien's search starts iterative calculations by substituting a variable of the error-location polynomial with a nonzero element in Galois Field, GF($2^m$), and the nonzero element ranges from $\alpha^{p+1}$ to $\alpha^n$, wherein n is a codelength of the BCH codeword and equals $2^m-1$, and m is a positive integer.

2. A circuit for shortening latency of Chien's search, comprising:
- a plurality of calculating units, each iteratively substituting a variable to a specified power of an error-location polynomial having maximum power of t with a nonzero element, k, in $GF(2^m)$, for multiplying a corresponding coefficient of the error-location polynomial by k to the specified power as a cyclic product and outputting the cyclic product, wherein k changes from $\alpha^{p+1}$ to $\alpha^n$ sequentially for each iterative calculation, wherein n is a codelength of a BCH codeword and equals $2^m-1$, p is a number of successive zeroes from the first bit of the BCH codeword and m is a positive integer; and
- a finite adder for summing a constant coefficient of the error-location polynomial and all cyclic products outputted from the calculating units in the same iterative calculation as a judging factor.

3. The circuit according to claim 2, further comprising a judging module for judging if the judging factor is zero.

4. The circuit according to claim 2, wherein the coefficients of the error-location polynomial are provided by an error-location polynomial generator.

5. The circuit according to claim 2, wherein each calculating unit comprises:
- a coefficient multiplexer for receiving the corresponding coefficient of the error-location polynomial and one cyclic product, and outputting the corresponding coefficient of the error-location polynomial during a first cycle and the cyclic product during cycles later than the first cycle as a first data;
- a resister, electrically linked to the coefficient multiplexer, for temporarily storing the first data for one cycle and outputting the first data;
- a shifting multiplier, electrically linked to the resister, for multiplying the first data by $rk/\alpha$ as a second data and outputting the second data;
- a shifting multiplexer, electrically linked to the resister and shifting multiplier, for receiving the first data and the second data and outputting the second data during a second cycle after the first cycle and the first data during cycles later than the second cycle; and
- an iterative multiplier, electrically linked to the shifting multiplexer, the coefficient multiplexer and the finite adder, for receiving the first data and second data, multiplying the received first data or second data by $\alpha^r$ as the cyclic product and outputting the cyclic product to the finite adder and the coefficient multiplexer,
- wherein r is a positive integer, varies from 1 to t in one iterative calculation, and represents the order of the power of the variable in the error-location polynomial the calculating unit is for.

6. An Error Correcting Code (ECC) decoder comprising the circuit of claim 2 for decoding BCH codewords.

7. An Error Correcting Code (ECC) decoder comprising the circuit of claim 3 for decoding BCH codewords.

8. An Error Correcting Code (ECC) decoder comprising the circuit of claim 4 for decoding BCH codewords.

9. An Error Correcting Code (ECC) decoder comprising the circuit of claim 5 for decoding BCH codewords.

10. A circuit for shortening latency of Chien's search, comprising:
- a plurality of calculating units, each iteratively substituting a variable to a specified power of an error-location polynomial having maximum power of t with a nonzero element, k, in $GF(2^m)$, for simultaneously multiplying a corresponding coefficient of the error-location polynomial by k, changing from $\alpha^{p+(j-1)s+1}$ to $\alpha^{p+js}$, to the specified power as cyclic products in the $j^{th}$ iterative calculation and outputting s cyclic products in the $j^{th}$ iterative calculation, wherein n is a codelength of a BCH codeword and equals $2^m-1$, p is a number of successive zeroes from the first bit of the BCH codeword, m and j are positive integers, s is a number of sets of parallel computing and operation terminates when k runs to $\alpha^n$; and
- s finite adders, each summing a constant of the error-location polynomial and all cyclic products for one specified k outputted from the calculating units in the same iterative calculation as a judging factor.

11. The circuit according to claim 10, further comprising a judging module for judging if the judging factor is zero.

12. The circuit according to claim 10, wherein the coefficients of the error-location polynomial are provided by an error-location polynomial generator.

13. The circuit according to claim 10, wherein each calculating unit comprises:
- a coefficient multiplexer for receiving the corresponding coefficient of the error-location polynomial and one cyclic product, and outputting the corresponding coefficient of the error-location polynomial during a first cycle and the cyclic product during cycles later than the first cycle as a first data;
- a resister, electrically linked to the coefficient multiplexer, for temporarily storing the first data for one cycle and outputting the first data;
- a shifting multiplier, electrically linked to the resister, for multiplying the first data by $rk/\alpha$ as a second data and outputting the second data;
- a shifting multiplexer, electrically linked to the resister and shifting multiplier, for receiving the first data and the second data and outputting the second data during a second cycle after the first cycle and the first data during cycles later than the second cycle; and
- s iterative multipliers, electrically linked to the shifting multiplexer, each receiving the first data and second data, multiplying the first data or second data by $\alpha^{qr}$ as the cyclic product, and outputting the cyclic products to the finite adders, respectively, wherein the iterative multiplier outputs the cyclic product of $\alpha^{r(p+s)}$ to the coefficient multiplexer,
- wherein r is a positive integer, varies from 1 to t in one iterative calculation and represents the order of the power of the variable in the error-location polynomial the calculating unit is for, and q is a positive integer and ranges from 1 to s in one iterative calculation.

14. An Error Correcting Code (ECC) decoder comprising the circuit of claim 10 for decoding BCH codewords.

15. An Error Correcting Code (ECC) decoder comprising the circuit of claim 11 for decoding BCH codewords.

16. An Error Correcting Code (ECC) decoder comprising the circuit of claim 12 for decoding BCH codewords.

17. An Error Correcting Code (ECC) decoder comprising the circuit of claim 13 for decoding BCH codewords.

* * * * *